United States Patent [19]

Nicholes et al.

[11] Patent Number: 5,289,427

[45] Date of Patent: Feb. 22, 1994

[54] MULTIPORT MEMORY WITH WRITE PRIORITY DETECTOR

[75] Inventors: James W. Nicholes, Gilbert; Douglas D. Smith, Mesa, both of Ariz.

[73] Assignee: Motorola, Inc., Schaumburg, Ill.

[21] Appl. No.: 915,222

[22] Filed: Jul. 20, 1992

[51] Int. Cl.$^5$ .............................................. G11C 8/00
[52] U.S. Cl. .............................. 365/230.05; 365/191; 365/230.06
[58] Field of Search ............... 365/189.04, 230.05, 365/230.06, 191

[56] References Cited

U.S. PATENT DOCUMENTS

| | | | |
|---|---|---|---|
| 4,158,235 | 6/1979 | Call et al. | 365/49 |
| 4,402,067 | 8/1983 | Mass et al. | 365/230.05 |
| 4,752,915 | 6/1988 | Suzuki et al. | 365/230.03 |
| 5,001,671 | 3/1991 | Koo et al. | 365/230.05 |
| 5,014,247 | 5/1991 | Albachten et al. | 365/230.05 |
| 5,042,013 | 8/1991 | Sato | 365/230.05 |
| 5,060,145 | 10/1991 | Scheuneman et al. | 365/230.05 |

*Primary Examiner*—Eugene R. LaRoche
*Assistant Examiner*—Michael C. Kessell
*Attorney, Agent, or Firm*—Robert D. Atkins

[57] ABSTRACT

A write priority detector in a multiport memory prioritizes write operations to memory cell by activating one of its enable signals to a memory cell upon receiving multiple address signals at different write ports of the multiport memory, each attempting to access the same memory cell. The other enable signals are de-activated. One prioritization scheme provides first-come first-serve access to the memory cell among completing address signals. Alternately, a fixed priority scheme always gives one enable signal first priority.

13 Claims, 5 Drawing Sheets

MULTIPORT MEMORY WITH WRITE PRIORITY DETECTOR

BACKGROUND OF THE INVENTION

The present invention relates in general to memory circuits and, more particularly, to a multiport memory with a write priority detector.

A multiport memory includes three or more read and/or write ports. Each read port and write port includes separate data lines and address lines whereby multiple peripheral devices may independently read from and write to a particular memory cell. For example, a first peripheral device may access physical memory location "0000" through write port 0. A second peripheral device may also access the same memory location "0000" through write port 1. The multiple read ports provide a similar common access to each memory cell. Thus, a multiport memory allows peripheral devices to share physical memory.

One obvious problem with the multiport memory is the write contention possible when two peripheral devices attempt writing to the same memory location simultaneously, or at least during the same write operation. A common solution in the prior art is to perform an address comparison external to the multiport memory and halt the write operation should the write addresses match. Since the address comparison circuitry tends to be complex, and the complexity increases rapidly with more write ports, the multiport memory in the prior art is typically limited to two write ports It is desirable to increase the number of write ports available to allow the multiport memory to interface with more peripheral devices.

Hence, a need exists for a multiport memory capable of internally detecting and resolving address conflicts during write operations without significant loss in system speed or performance.

DETAILED DESCRIPTION OF THE PREFERRED EMBODIMENT

Figure 1:
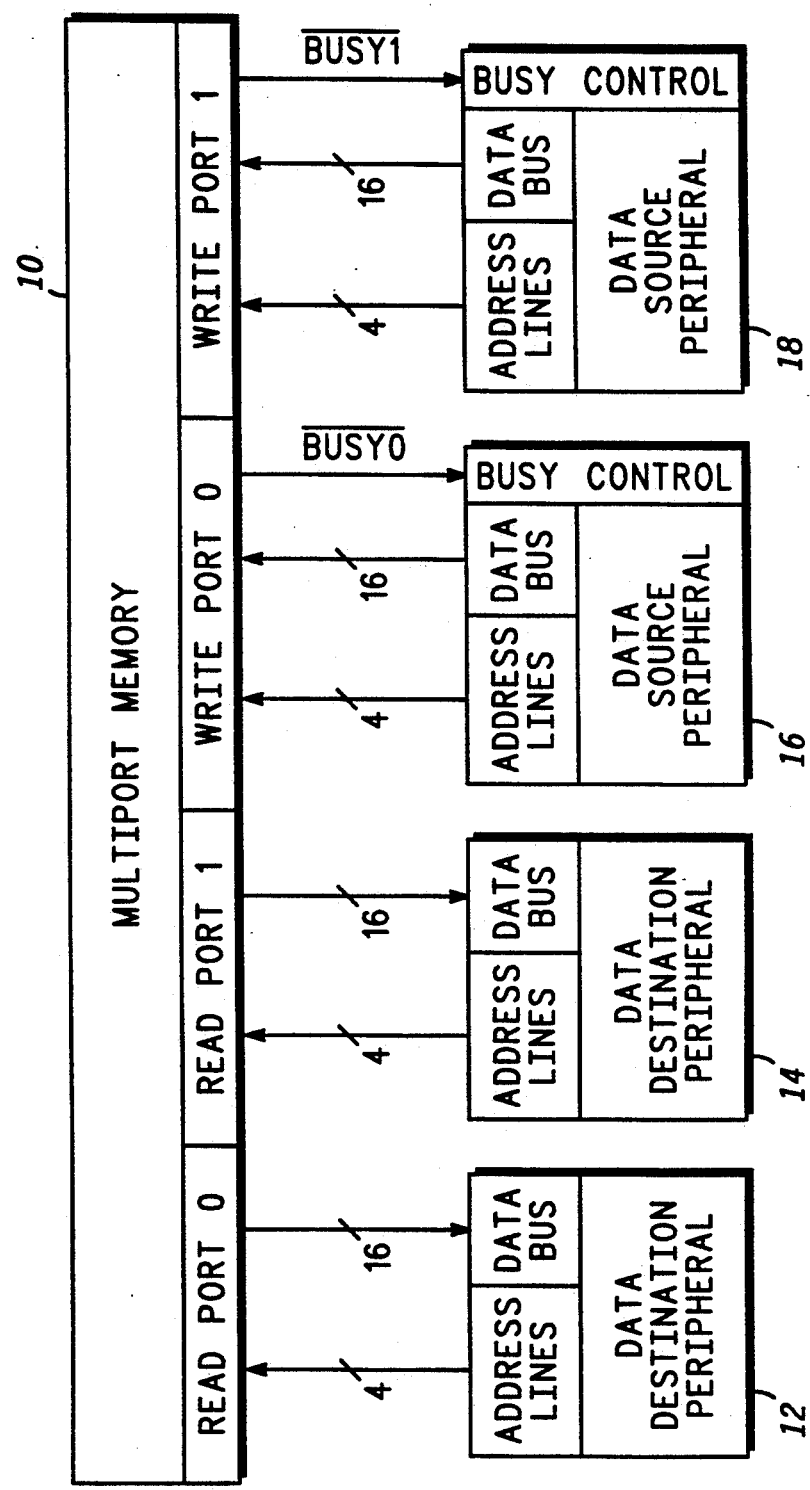
FIG. 1 is a block diagram illustrating a 2-write/2-read multiport memory.

Referring to FIG. 1, multiport memory 10 includes read port 0 and read port 1 coupled for sending data to peripheral devices 12 and 14, respectively. Peripheral devices 16 and 18 send data to write port 0 and write port 1 of multiport memory 10 for storage in its memory locations. Examples of peripheral devices 12-18 include magnetic disk storage, modem links, printers and ROM. Address lines from peripheral devices 12-18 are applied to read port 0, read port 1, write port 0 and write port 1, respectively, allowing each to independently read from and write to physical memory locations of multiport memory 10.

Simultaneous read operations from the same physical memory location is generally not a problem in multiport memory 10 However, multiport memory 10 detects an attempt by peripheral devices 16 and 18 to write through write port 0 and write port 1 to the same physical memory location during the same write operation. When peripheral devices 16 and 18 attempt to write to the same physical memory location during the same write operation, multiport memory 10 gives priority to one peripheral device and issues a busy signal $\overline{BUSY0}$ or $\overline{BUSY1}$ to the other peripheral device. The peripheral device denied access may try again or select another physical memory location.

Figure 2:
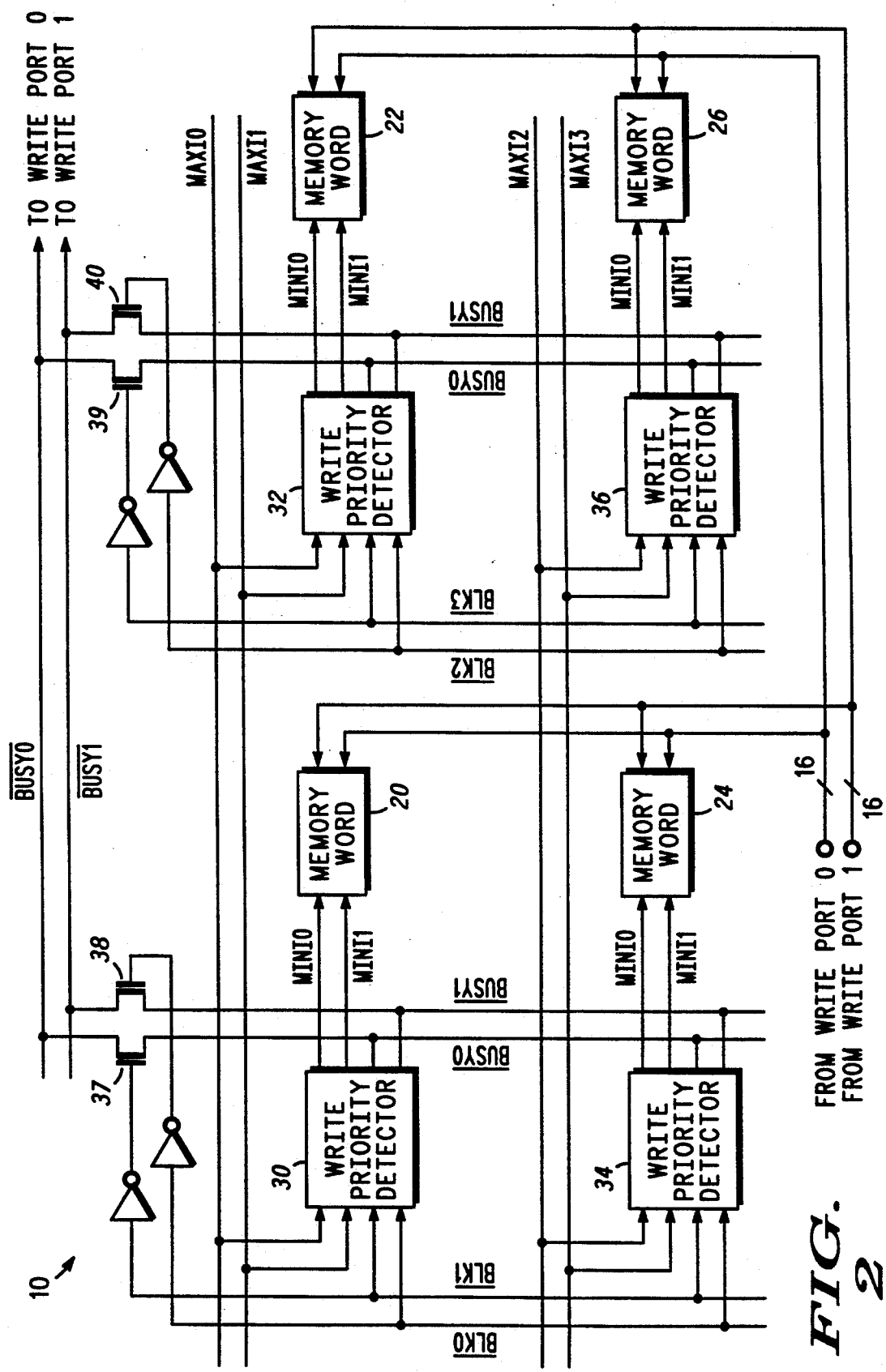
FIG. 2 is a block diagram illustrating write priority detectors in a memory array of FIG. 1.

Turning to FIG. 2, further detail of multiport memory is shown as an array of addressable memory locations each with its own write priority detector to resolve contentions between competing write operations. The address words from peripheral devices 16 and 18 are decoded into MAXIm and $\overline{BLKn}$ enable lines (m and n are integers) which in turn address a particular memory word. A MAXIm line enables a row of memory words across the entire array. The $\overline{BLKn}$ enable line corresponds to an addressable block of data (word width). The intersection of a MAXIm enable line and a $\overline{BLKn}$ enable line selects a particular memory word. For example, assume memory word 20 contains 16-bits of data with a physical address "0000". An address word of "0000" from peripheral device 16 applied at write port 0 of multiport memory 10 decodes to a logic one for MAXI0 and a logic zero for $\overline{BLK0}$ to access the 16-bits in memory word 20. An address word of "0001" from peripheral device 16 may decode to logic one for MAXI0 and logic zero for $\overline{BLK2}$, thereby addressing 16-bit memory word 22. Likewise, an address word of "0010" from peripheral device 16 may decode to logic one for MAXI2 and logic zero $\overline{BLK0}$ to address 16-bit memory word 24, while an address word of "0011" from peripheral device 16 decodes to logic one for MAXI2 and logic zero for $\overline{BLK2}$, thereby addressing 16-bit memory word 26.

Peripheral device 18 is also capable of addressing memory words 20-26 using the same address words. However, the decode logic in multiport memory 10 (not shown) activates different MAXIm and $\overline{BLKn}$ enable lines. An address word of "0000" applied at write port 1 from peripheral device 18 enables MAXI1 and $\overline{BLK1}$ to address memory word 20. Similarly, an address word of "0001" from peripheral device 18 may activate MAXI1 and $\overline{BLK3}$ for memory word 22, while an address word of "0010" activates MAXI3 and $\overline{BLK1}$ for memory word 24, and an address word of "0011" activates MAXI3 and $\overline{BLK3}$ for memory word 26.

Write priority detector 30 receives the MAXI0/$\overline{BLK0}$ and MAXI1/$\overline{BLK1}$ combinations from the decode of the address word "0000" applied at write port 0 and write port 1, respectively, and activates a MINI0 or MINI1 enable line to memory word 20. The MAXI0/$\overline{BLK0}$ combination activates MINI0, and the MAXI1/$\overline{BLK1}$ combination activates MINI1. MINI0 and MINI1 are mutually exclusive in enabling memory word 20. Write priority detector 30 receives one MAXIm/$\overline{BLKn}$ combination from each write port of multiport memory 10 and activates a corresponding MINI line according to a predetermined priority scheme. FIG. 1 illustrates two write ports for multiport memory 10, hence, write priority detector 30 in FIG. 2 receives two MAXIm/$\overline{BLKn}$ combinations and activates one of two MINI enable lines. Three write ports would involve a write priority detector receiving three MAXIm/$\overline{BLKn}$ combinations and activating one of three MINI enable lines according to the priority scheme. Write priority detectors 32, 34 and 36 administrate write contention for memory words 22, 24 and 26, respectively. The busy signals from write priority detectors 30-36 are coupled through pass transistors 37, 38, 39 and 40 to $\overline{BUSY0}$ or $\overline{BUSY1}$ lines which are routed back to write port 0 and write port 1. The gates of transistors 37-40 receive inverted $\overline{BLK0}$, $\overline{BLK1}$, $\overline{BLK2}$ and $\overline{BLK3}$ signals, respectively.

Figure 3:
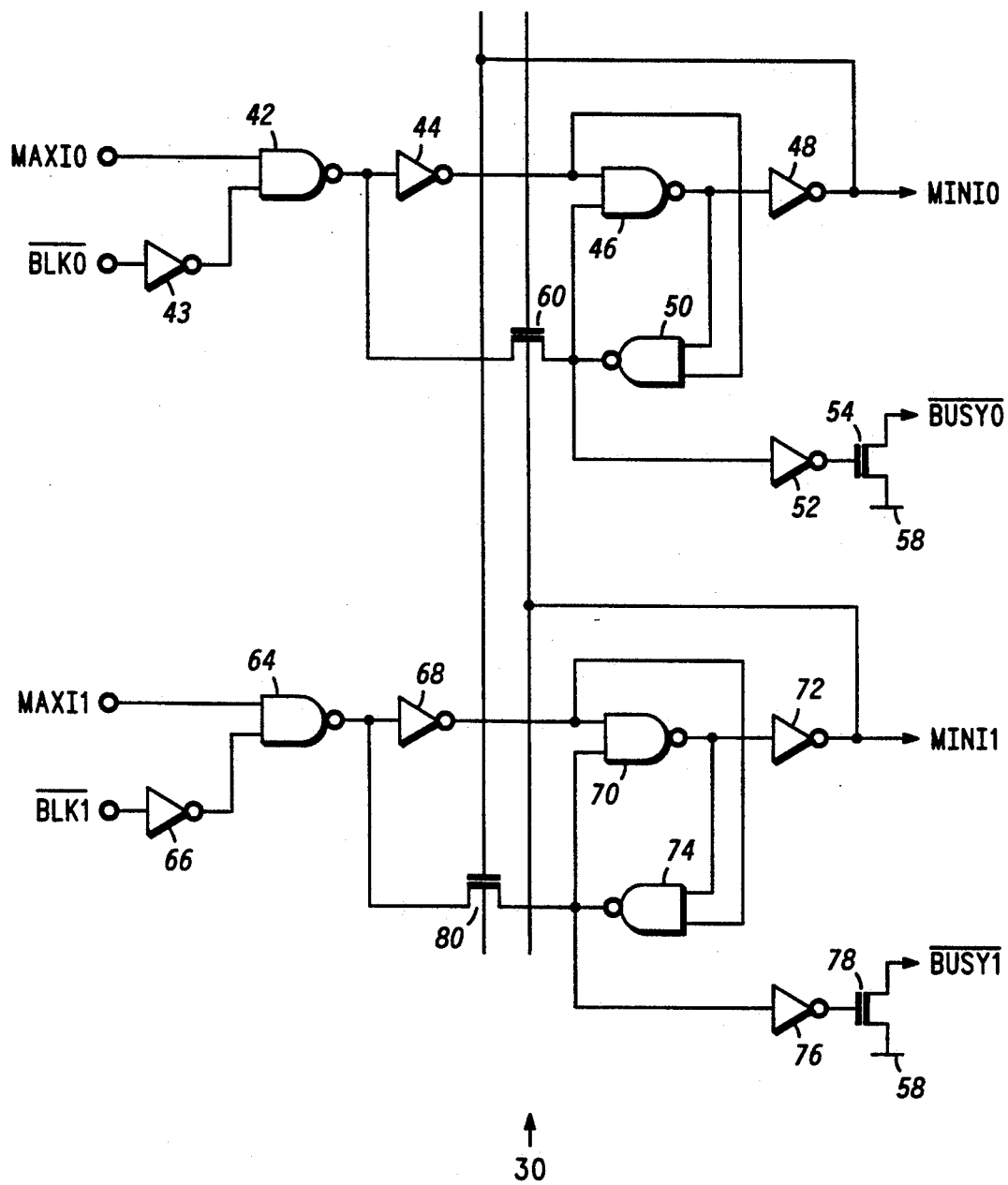
FIG. 3 is a schematic diagram illustrating the write priority detector of FIG. 2.

In FIG. 3, write priority detector 30 is shown including NAND gate 42 having a first input coupled for receiving MAXI0 and a second input coupled for receiving $\overline{BLK0}$ inverted by inverter 43. The output of NAND gate 42 is coupled through inverter 44 to a first input of NAND gate 46. The output of NAND gate 46 is coupled to the input of inverter 48 which provides the MINI0 line at its output. NAND gate 50 includes a first input coupled to the output of inverter 44 and a second input coupled to the output of NAND gate 46. The output of NAND gate 50 is coupled to a second input of NAND gate 46 and through inverter 52 to a gate of transistor 54. The drain of transistor 54 is coupled to the $\overline{BUSY0}$ line which continues through transistor 37 of FIG. 2 to write port 0. The source of transistor 54 is coupled to power supply conductor 58 operating at ground potential. The output of NAND gate 42 is also coupled through N-channel pass transistor 60 to the second input of NAND gate 46.

Write priority detector 30 also includes NAND gate 64 having a first input coupled for receiving MAXI1 and a second input coupled for receiving $\overline{BLK1}$ inverted by inverter 66. The output of NAND gate 64 is coupled through inverter 68 to a first input of NAND gate 70. The output of NAND gate 70 is coupled to the input of inverter 72 which provides the MINI1 line at its output. NAND gate 74 includes a first input coupled to the output of inverter 68 and a second input coupled to the output of NAND gate 70. The output of NAND gate 74 is coupled to a second input of NAND gate 70 and through inverter 76 to a gate of transistor 78. The drain of transistor 78 is coupled to the $\overline{BUSY1}$ line which continues through transistor 38 of FIG. 2 to write port 1. The source of transistor 78 is coupled to power supply conductor 58. The output of NAND gate 64 is also coupled through N-channel pass transistor 80 to the second input of NAND gate 70. The gate of transistor 80 is coupled to the MINI0 enable line, and the gate of transistor 60 is coupled to the MINI1 enable line.

Write priority detector 30 is shown with two detector circuits 42-60 and 64-80 corresponding to write port 0 and write port 1, respectively. It is understood that any number of detector circuits may be added to write priority detector 30 to support more write ports in multiport memory 10. Each detector circuit may access memory word 20 with a MINI enable line corresponding to the write port attempting a write operation. Write priority detector enables only one MINI line according to the priority scheme, even with simultaneous write operations received at the multiple write ports of multiport memory 10.

Consider the operation of write priority detector 30 where peripheral device 16 attempts first in time to access memory word 20 at physical address "0000", followed asynchronously by peripheral device 18 attempting to access the same memory word 20 during the same write operation. Before the write operation the outputs of NAND gates 42 and 64 are logic one. The MAXI0 goes to logic one and $\overline{BLK0}$ goes to logic zero following decode of the "0000" address word from peripheral device 16. The output of NAND gate 42 goes to logic zero and the output of inverter 44 is logic one. The output of NAND gate 46 goes to logic zero because of the initial logic one at the output of NAND gate 50. The MINI0 line goes to logic one. The logic one at the output of inverter 44 starts to drive the output of NAND gate 50 to logic zero because the output of NAND gate 46 was still logic one before it switches in response to the write operation. However, NAND gate 46 is made a much larger and faster device such that the output of NAND gate 46 becomes logic zero before NAND gate 50 can switch to logic zero. NAND gates 46 and 50 form a register where the transistors of NAND gate 50 have approximately twice the gate length and one-fifth the gate width as the transistors of NAND gate 46 making the propagation delay through NAND gate 50 much longer. NAND gate 46 thus maintains the output of NAND gate 50 at logic one, whereby transistor 54 remains in a non-conductive state.

Before MAXI1 and $\overline{BLK1}$ become active from the write access by peripheral device 18 during the write operation of peripheral device 16, the output of NAND gate 64 is logic one and the output of NAND gate 70 is logic one producing a logic zero on the MINI1 line. The output of NAND gate 74 is logic one and transistors 60 and 78 are off. The logic one MINI0 line turns on pass transistor 80. The outputs of NAND gates 64 and 74 are logic one across transistor 80.

Now assume the write operation from peripheral device 18 attempts to address memory word 20 by activating MAXI1 and $\overline{BLK1}$ enable lines before completion of the write operation still executing from peripheral device 16. The MINI0 line is still logic one and transistor 80 conducting as described above. The output of NAND gate 64 goes to logic zero and passes through transistor 80 to drive the second input of NAND gate 70 to logic zero. NAND gate 74 is made a small device to allow the logic zero from transistor 80 to overpower the output of NAND gate 74. The logic zero through transistor 80 arrives at NAND gate 70 before the logic one from inverter 68 because of the longer delay through inverter 68. Thus, the output of NAND gate 70 remains logic one because of the logic zero from transistor 80 arrives first. NAND gate 74 switches to logic zero from the logic ones at the output of inverter 68 and the output of NAND gate 70. The MINI1 line remains logic zero preventing the write operation from peripheral device 18 from accessing memory word 20. The output of inverter 76 becomes logic one turning on transistor 78 and pulling the $\overline{BUSY1}$ line to logic zero through transistor 38 enabled by inverted $\overline{BLK1}$, thereby indicating to peripheral device 18 that the write operation failed. Either the MAXI1 and/or the $\overline{BLK1}$ lines must go inactive to reset NAND gates 70 and 74 before the second write operation may be re-attempted.

Alternately, if the write operation from peripheral device 18 is initiated before the write operation from peripheral device 16, the MINI1 line switches to logic one enabling write access to memory word 20 and further turning on transistor 60 A subsequent write operation from peripheral device 16 produces a logic zero at the output of NAND gate 42 which passes through transistor 60 before the logic one arrives at the output of inverter 44. The output of NAND gate 46 remains at logic one and the MINI0 line at logic zero, thereby locking out the second write operation from peripheral device 16.

A key feature of the present invention is the use of the MINI0 line to enable transistor 80 and pass the logic zero state at the output of NAND gate 64 to NAND gate 70 before the same logic zero state is inverted to logic one by inverter 68. The output of NAND 70 cannot switch to logic zero thereby locking out the MINI1 line. Similarly, if the MINI1 line activates first, the MINI0 line is locked out. Thus, the write priority scheme is first-come first-serve.

The present invention supports any number of write ports by adding other detector circuits like 42-60 and Γ-80 in write priority detector 30. For example, a third detector (not shown) would duplicate components 42-60 and further include a second pass transistor in parallel with the existing pass transistor. That is, another pass transistor is added in parallel with transistor 60, and another pass transistor is added in parallel with transistor 80, and two pass transistors are included for the third detector, totaling of six pass transistors. The second pass transistors of the first and second detectors are enabled by a MINI2 line of the third detector. The pass transistors in the third detector are enabled by the MINI0 and MINI1 lines. A fourth detector (not shown) includes three parallel pass transistors with the third transistor of first, second and third detectors receiving a MINI3 line of the fourth detector. The pass transistors in the fourth detector are enabled by the MINI0, MINI1 and MINI2 lines. Note each detector does not enable a pass transistor in its own conduction path. Thus, the detector receiving a write operation first in time locks our the other detectors preventing write conflicts to memory word 20.

For the situation where the write operations from peripheral devices 16 and 18 arrive exactly simultaneously, the MINI0 and MINI1 lines both become active for a short time long enough to enable transistors 60 and 80 and pass logic zeroes to the second inputs of NAND gates 46 and 70. The outputs of NAND gates 46 and 70 switch to logic one which are maintained by the register operation of NAND gates 50 and 74, respectively. The MINI0 and MINI1 lines are disabled and the logic zeroes at the outputs of NAND gates 50 and 74 enable the BUSY0 and BUSY1 lines to notify peripheral devices 16 and 18 of both unsuccessful write operations. Write priority detectors 32-36 follow a similar construction and operation described for write priority detector 30.

Figure 4:
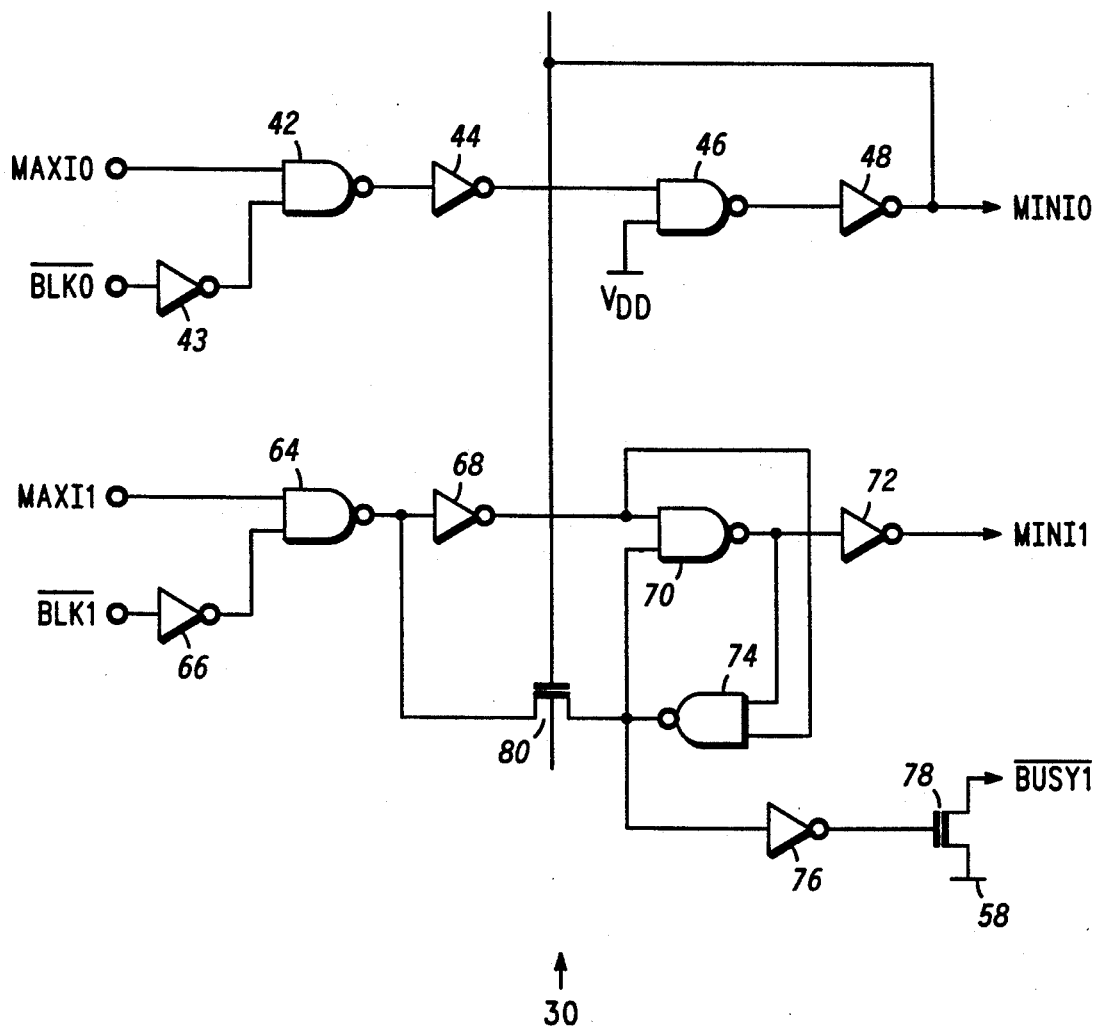
FIG. 4 is a schematic diagram illustrating an alternate write priority detector of FIG. 2.

A fixed priority scheme intended primarily for port-to-port synchronous applications is shown in FIG. 4 implemented by removing the pass transistor and busy transistor from the first detector 42-48. The second detector 64-80 includes pass transistor 80 enabled by the MINI0 line. The second input of NAND gate 46 receives a logic one from $V_{DD}$. A third detector would include two pass transistors enabled by the MINI0 and MINI1 lines, and a fourth detector would include three pass transistor enabled by the MINI0, MINI1 and MINI2 lines. The priority scheme always gives first priority to the first detector 42-48 anytime it receives a write operation. The second detector always gets second priority, and so on.

Figure 5:
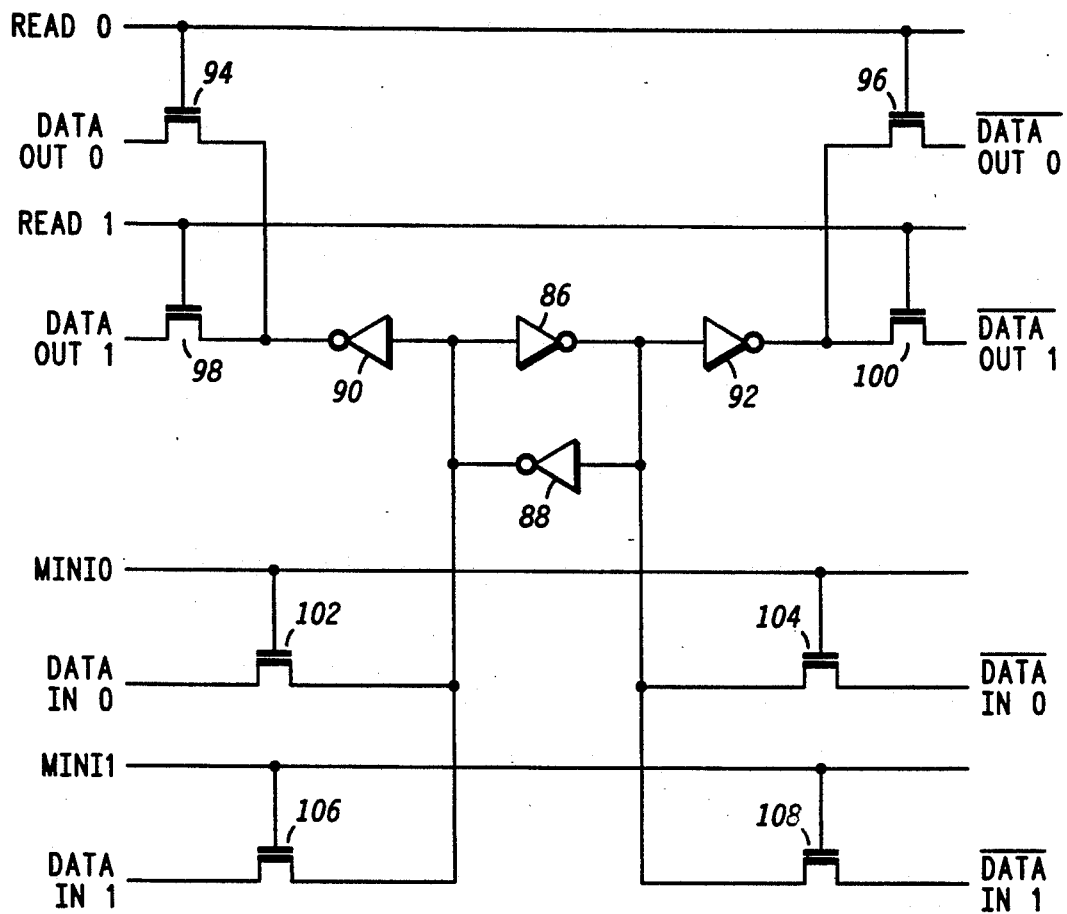
FIG. 5 is a schematic diagram illustrating a memory cell of FIG. 2.

One memory cell of memory word 20 is illustrated in FIG. 5. Inverters 86 and 88 operate as a basic memory cell storing one bit of the 16-bit data word. Buffers 90 and 92 provide drive to the read data lines. The READ0 line enables transistors 94 and 96 to pass the data bit and its complement to read port 0, while the READ1 line enables transistors 98 and 100 to pass the data bit and its complement to read port 1. The MINI0 line enables transistors 102 and 104 to receive a data bit and its complement from write port 0 into memory cell 86-88. The MINI1 line enables transistors 106 and 108 to receive a data bit and its complement from write port 1 into memory cell 86-88. When write priority detector 30 enables the MINI0 line, the data applied at write port 0 is stored in memory cell 86-88. Alternately, when write priority detector 30 enables the MINI1 line, the data applied at write port 1 is stored in memory cell 86-88.

A key feature of the present invention is the ability to perform write contention detection and prioritization on-chip in the memory array. While specific embodiments of the present invention have been shown and described, further modifications and improvements will occur to those skilled in the art It is understood that the invention is not limited to the particular forms shown and it is intended for the appended claims to cover all modifications which do not depart from the spirit and scope of this invention.

What is claimed is:

1. A multiport memory circuit, comprising:
    a memory cell having first and second data inputs and having first and second enable inputs receiving first and second enable signals, said first enable signal allowing said first data input to receive data for storage in said memory cell, said second enable signal allowing said second data input to receive data for storage in said memory cell; and
    a write priority detector coupled for receiving first and second address signals and providing said first and second enable signals respectively, said write priority detector including,
    (a) a first inverter having an input receiving said first address signal and having an output,
    (b) a first logic gate having first and second inputs and an output, said first input being coupled to said output of said first inverter, said output providing said first enable signal,
    (c) a second logic gate having first and second inputs and an output, said first input being coupled to said output of said first inverter, said second input being coupled to said output of said first logic gate, said output being coupled to said second input of said first logic gate, and
    (d) a first transistor having a gate, a drain and a source, said drain being coupled to said input of said first inverter, said gate receiving said second enable signal, said source being coupled to said second input of said first logic gate.

2. The multiport memory circuit of claim 1 wherein said first and second address signals each include a maxi signal and a block signal.

3. The multiport memory circuit of claim 2 wherein said write priority detector includes:
    a third logic gate having first and second inputs and an output, said first input receiving said maxi signal of said first address signal, said second input receiving said block signal of said first address signal; and
    a second inverter having an input coupled to said output of said first logic gate and having an output for providing an inverted first enable signal.

4. The multiport memory circuit of claim 3 wherein said write priority detector further includes:

a third inverter having an input coupled to said output of said second logic gate and having an output; and a second transistor having a gate, a drain and a source, said drain providing a first busy signal, said gate being coupled to said output of said third inverter, said source being coupled to a first power supply conductor.

5. The multiport memory circuit of claim 4 wherein said write priority detector further includes:

a fourth logic gate having first and second inputs and an output, said first input receiving said maxi signal of said second address signal, said second input receiving said block signal of said second address signal;

a fourth inverter having an input coupled to said output of said fourth logic gate and having an output;

a fifth logic gate having first and second inputs and an output, said first input being coupled to said output of said fourth inverter; and a fifth inverter having an input coupled to said output of said fifth logic gate and having an output for providing said second enable signal.

6. The multiport memory circuit of claim 5 wherein said write priority detector further includes:

a sixth logic gate having first and second inputs and an output, said first input being coupled to said output of said fourth inverter, said second input being coupled to said output of said fifth logic gate, said output being coupled to said second input of said fifth logic gate; and a third transistor having a gate, a drain and a source, said drain being coupled to said output of said fourth logic gate, said gate receiving said first enable signal, said source being coupled to said second input of said fifth logic gate.

7. The multiport memory circuit of claim 6 wherein said write priority detector further includes:

a sixth inverter having an input coupled to said output of said sixth logic gate and having an output; and a fourth transistor having a gate, a drain and a source, said drain providing a second busy signal, said gate being coupled to said output of said sixth inverter, said source being coupled to said first power supply conductor.

8. A write priority detector in a memory circuit, comprising:

a first logic gate having first and second inputs and an output, said first input receiving a maxi signal of a first address signal, said second input receiving a block signal of said first address signal;

a first inverter having an input coupled to said output of said first logic gate and having an output;

a second logic gate having first and second inputs and an output, said first input being coupled to said output of said first inverter, said output providing a first enable signal;

a third logic gate having first and second inputs and an output, said first input being coupled to said output of said first inverter, said second input being coupled to said output of said second logic gate, said output being coupled to said second input of said second logic gate; and a first transistor having a gate, a drain and a source, said drain being coupled to said output of said first logic gate, said gate receiving a second enable signal, said source being coupled to said second input of said second logic gate.

9. The write priority detector of claim 8 further including a second inverter having an input coupled to said output of said second logic gate and having an output for providing an inverted first enable signal.

10. The write priority detector of claim 9 further including:

a third inverter having an input coupled to said output of said third logic gate and having an output; and a second transistor having a gate, a drain and a source, said drain providing a first busy signal, said gate being coupled to said output of said third inverter, said source being coupled to a first power supply conductor.

11. The write priority detector of claim 10 further including:

a fourth logic gate having first and second inputs and an output, said first input receiving a maxi signal of a second address signal, said second input receiving a block signal of said second address signal;

a fourth inverter having an input coupled to said output of said fourth logic gate and having an output;

a fifth logic gate having first and second inputs and an output, said first input being coupled to said output of said fourth inverter, and a fifth inverter having an input coupled to said output of said fifth logic gate and having an output for providing said second enable signal.

12. The write priority detector of claim 11 further including;

a sixth logic gate having first and second inputs and an output, said first input being coupled to said output of said fourth inverter, said second input being coupled to said output of said fifth logic gate, said output being coupled to said second input of said fifth logic gate; and a third transistor having a gate, a drain and a source, said drain being coupled to said output of said fourth logic gate, said gate receiving said second enable signal, said source being coupled to said second input of said fifth logic gate.

13. The write priority detector of claim 12 further including:

a sixth inverter having an input coupled to said output of said sixth logic gate and having an output; and a fourth transistor having a gate, a drain and a source, said drain providing a second busy signal, said gate being coupled to said output of said sixth inverter, said source being coupled to said first power supply conductor.

* * * * *